United States Patent
Jung et al.

(10) Patent No.: US 6,903,955 B2
(45) Date of Patent: Jun. 7, 2005

(54) SEMICONDUCTOR MEMORY DEVICE HAVING CONSISTENT SKEW OVER ENTIRE MEMORY CORE

(75) Inventors: Hyun-Taek Jung, Seoul (KR); Gyu-Hong Kim, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 47 days.

(21) Appl. No.: 10/455,316

(22) Filed: Jun. 6, 2003

(65) Prior Publication Data

US 2004/0022083 A1 Feb. 5, 2004

(30) Foreign Application Priority Data

Aug. 2, 2002 (KR) ................................. 10-2002-0045913

(51) Int. Cl.[7] .............................. G11C 5/06; G11C 7/00; G06F 13/00; G06F 13/14
(52) U.S. Cl. ..................... 365/63; 365/189.05; 365/191; 710/100; 710/305
(58) Field of Search .............................. 365/63, 189.05, 365/191; 710/100, 305

(56) References Cited

U.S. PATENT DOCUMENTS

| | | | | |
|---|---|---|---|---|
| 5,982,698 A | * | 11/1999 | Tsukude | ................ 365/230.03 |
| 6,300,651 B1 | * | 10/2001 | Kato | ........................... 257/207 |
| 6,370,079 B1 | * | 4/2002 | Jung et al. | ............. 365/230.06 |
| 6,477,592 B1 | * | 11/2002 | Chen et al. | .................... 710/52 |
| 6,781,984 B1 | * | 8/2004 | Adam et al. | ................ 370/360 |
| 2002/0180501 A1 | * | 12/2002 | Baker et al. | ................ 327/158 |
| 2003/0174075 A1 | * | 9/2003 | Iwata | ........................... 341/56 |
| 2003/0185088 A1 | * | 10/2003 | Kono | ........................ 365/233 |
| 2003/0199262 A1 | * | 10/2003 | Chung | ........................ 455/265 |
| 2003/0212975 A1 | * | 11/2003 | Frerichs et al. | ............... 716/10 |
| 2004/0004897 A1 | * | 1/2004 | Kang | .................... 365/230.03 |
| 2004/0158757 A1 | * | 8/2004 | Lin | ........................... 713/401 |

* cited by examiner

Primary Examiner—David Nelms
Assistant Examiner—Ly Duy Pham
(74) Attorney, Agent, or Firm—Harness, Dickey & Pierce, P.L.C.

(57) ABSTRACT

A semiconductor memory device including a memory core, a data input circuit, a data output circuit, at least one data input/output line, at least one row control signal and at least one column control signal, wherein the data input circuit and the data output circuit are separately arranged, the memory core is positioned between the data input circuit and the data output circuit, the data input/output line extends from the data input circuit to the data output circuit across the memory core, and the row control signal line and the column control signal line simultaneously start from a first side of the data input circuit, proceed in along a side of the memory core to a corner of the memory core, the core being adjacent to the data output circuit, and then run from the corner to the opposite corner of the memory core.

5 Claims, 2 Drawing Sheets

SEMICONDUCTOR MEMORY DEVICE HAVING CONSISTENT SKEW OVER ENTIRE MEMORY CORE

BACKGROUND OF INVENTION

This U.S. nonprovisional patent application claims priority under 35 U.S.C. § 119 of Korean Patent Application 2002-45913 filed on Aug. 2, 2002, the entire contents of which is hereby incorporated by reference.

1. Field of the Invention

The present invention relates to a semiconductor memory device, and more particularly to a semiconductor memory device having consistent skew over the entire memory core thereof.

2. Description of Related Art

Semiconductor memory has become a mainstay of digital electronic devices. Increasing the operating speed of semiconductor memory remains an on-going pursuit for research in the semiconductor field. For example, processor speeds in a typical personal computer have crossed the gigahertz threshold, and hence require high speed memory and bus architectures to achieve higher throughput. Improving the design of memory devices provides a significant opportunity in increasing memory operating speeds.

Memory designers aspire to overcome skew of the memory core to increase the access and read-write speed of a memory device. The presence of skew reduces the operating speed of the memory device. Further, the presence of asymmetric or inconsistent skew over a memory core poses a hurdle in increasing the operating speed of a semiconductor memory device.

Further, the operating speed of the semiconductor memory increases when there is a decrease in signal margin. The presence of skew, for example, inconsistent skew, inhibits reduction of signal margin, and consequently the increase of memory speeds.

FIG. 1 illustrates a schematic diagram of a memory core of a conventional semiconductor memory device. As shown in FIG. 1, a conventional semiconductor memory device includes a memory core 10 and a data input/output circuit 20 positioned below the memory core 10. As an example, the memory core 10 is divided into four sections including a first section A positioned at left upper corner, a second section B positioned at right upper corner, a third section C positioned at left lower corner and a fourth section D positioned at right lower corner. The time for transferring a signal or data from the first section A to the second section B, or vice versa is denoted by tAB. Further, the time for transferring a signal or data from the second section B to the fourth section D, or vice versa is denoted by tBD. A row control signal Sro starts from the right side of the data input/output circuit 20 and proceeds upward along the right side of the memory core 10. In the memory core 10, the row control signal Sro horizontally runs from right to left. On the other hand, a column control signal Sco starts from the center PC of the data input/output circuit 20, proceeds to the both sides of the data input/output circuit 20 in a horizontal direction. In the memory core 10, the column control signal Sco vertically runs from down to up.

The total data outputting time required for outputting data from each of the sections A–D of the memory core is calculated as follows. For the first section A, the total data outputting time Tdout for outputting data from the first section A of the memory core 10 is equal to the sum of a time tBD+tAB required for the row control signal Sro to reach the first section A, a time tAB/2+tBD required for the column control signal Sco to reach the first section A, a time tRA which is an operating time of the memory core in the first section A and a time tBD required for data to run from an input/output line 10 to the data input/output circuit 20; that is, Tdout=(3/2)tAB+3tBD+tRA.

For the second section B, the total data outputting time Tdout for outputting data from the second section B of the memory core is equal to the sum of a time tBD required for the row control signal to reach the second section B, a time tAB/2+tBD required for the row control signal to reach the second section B, a time tRB which is an operating time of the memory core at the second section B and a time tBD required for data to run from an input/output line 10 to the data input/output circuit 20; that is, Tdout=(1/2)tAB+3tBD+tRB.

For the third section C, the total data outputting time Tdout for outputting data from the third section C of the memory core is equal to the sum of a time tAB required for the row control signal to reach the third section C, a time tAB/2 required for the column control signal to reach the second section B of the memory core, a time tRC which is an operating time of the memory core at the third section C and a time "0" required for data to run from an input/output line 10 to the data input/output circuit 20; that is, Tdout=(3/2)tAB+tRC.

For the fourth section D, the total data outputting time Tdout for outputting data from the fourth section D of the memory core is equal to the sum of a time "0" required for the row control signal to reach the fourth section D, a time tAB/2 required for the column control signal to reach the fourth section D of the memory core, and a time tRD which is an operating time of the memory core at the fourth section D and a time "0" required for data to run from an input/output line 10 to the data input/output circuit 20; that is, Tdout=(1/2)tAB+tRD.

The time for the row control signal Sro to reach the first section A is tAB+tBD, and the time for the row control signal Sro to reach the fourth sections D is "0". Accordingly, signal skew is caused between the first section A and the fourth section D by the time tAB+tBD. A column control operation must begin after a row control operation is ended in the first section A to which the row control signal is reached last. Accordingly, undesired time loss of tAB+tBD occurs for the fourth section D. Further, the time for the column control signal Sco to reach the fourth section D is (1/2)tAB, and the time for the column control signal Sco to reach the first section A is (1/2)tAB+tBD. Accordingly, the column control signal is skewed between the first section A and the fourth section D by the time tBD. Still further, the time required for data to run from an independent input/output line 10 to the data input/output circuit 20 is "0" for the fourth section D and tBD for the first section A.

If the operating times of the memory core at the first to fourth sections A–D are the same, tRA=tRB=tRC=tRD. Then, a difference between the total data outputting times Tdout in the first section A and the fourth section D is tAB+3tBD. Accordingly, in the conventional semiconductor memory device, the signal skew is caused by the time tAB+3tBD between the best corner and the worst corner.

In the conventional semiconductor device as described above, signal margin reduction is limited because of the signal skew, and therefore it is difficult to improve an operating speed of the semiconductor memory device.

SUMMARY OF THE INVENTION

An exemplary embodiment of the present invention provides a semiconductor memory device having consistent skew over the memory core thereof.

An exemplary embodiment of the present invention provides a semiconductor memory device capable of operating normally even though signal margin is reduced.

In accordance with an exemplary embodiment, the present invention is directed to a semiconductor memory device including a memory core, a data input circuit, a data output circuit, at least one data input/output line, at least one row control signal line and at least one column control signal line, wherein the data input circuit and the data output circuit are separately arranged, the memory core is positioned between the data input circuit and the data output circuit, the data input/output line extends from the data input circuit to the data output circuit via the memory core, and the row control signal line and the column control signal line start from one side of the data input circuit and proceed in parallel along a first side of the memory core, and then run from the side of the memory core to an opposite side of the memory core.

In accordance with another exemplary embodiment, the present invention is directed to a semiconductor memory device comprising a memory core, including at least two sections, a data input circuit, a data output circuit, separate from the data inut circuit, and means for compensating for skew between the at least two sections of the memory core.

In exemplary embodiments, the means for compensating compensates for skew in data outputting and/or data inputting times.

In an exemplary embodiment, the means for compensating compensates for skew in data outputting times by balancing a time for a row control signal, a time for a column control signal, an operating time of the memory core, a time for data to run from an input/output IO line to the data output circuit and a time for a fetch operation for each of the at least two sections.

In an exemplary embodiment, the means for compensating compensates for skew in data inputting times by balancing a time for a row control signal, a time for a column control signal, an operating time of the memory core, a time for data to run from an input/output IO line to the data output circuit, a signal delay and a time delay for each of the at least two sections.

In an exemplary embodiment, the semiconductor memory device has consistent skew over the entire memory core. In an exemplary embodiment, a data input direction is the same as a direction of the row and column control signals.

In an exemplary embodiment, a data output direction is the same as a direction of the row and column control signals. In an exemplary embodiment, a direction of a data storing control signal is the same as a direction of the row and column control signals.

BRIEF DESCRIPTION OF THE DRAWINGS

These and other features and advantages of the present invention will be readily apparent to those of ordinary skill in the art upon review of the detailed description that follows when taken in conjunction with the accompanying drawings, wherein like reference numerals denote like parts, and in which.

DETAILED DESCRIPTION OF EXEMPLARY EMBODIMENTS

A semiconductor memory device in accordance with an exemplary embodiment of the present invention will be described in detail with reference to drawings accompanied herewith.

Figure 1:
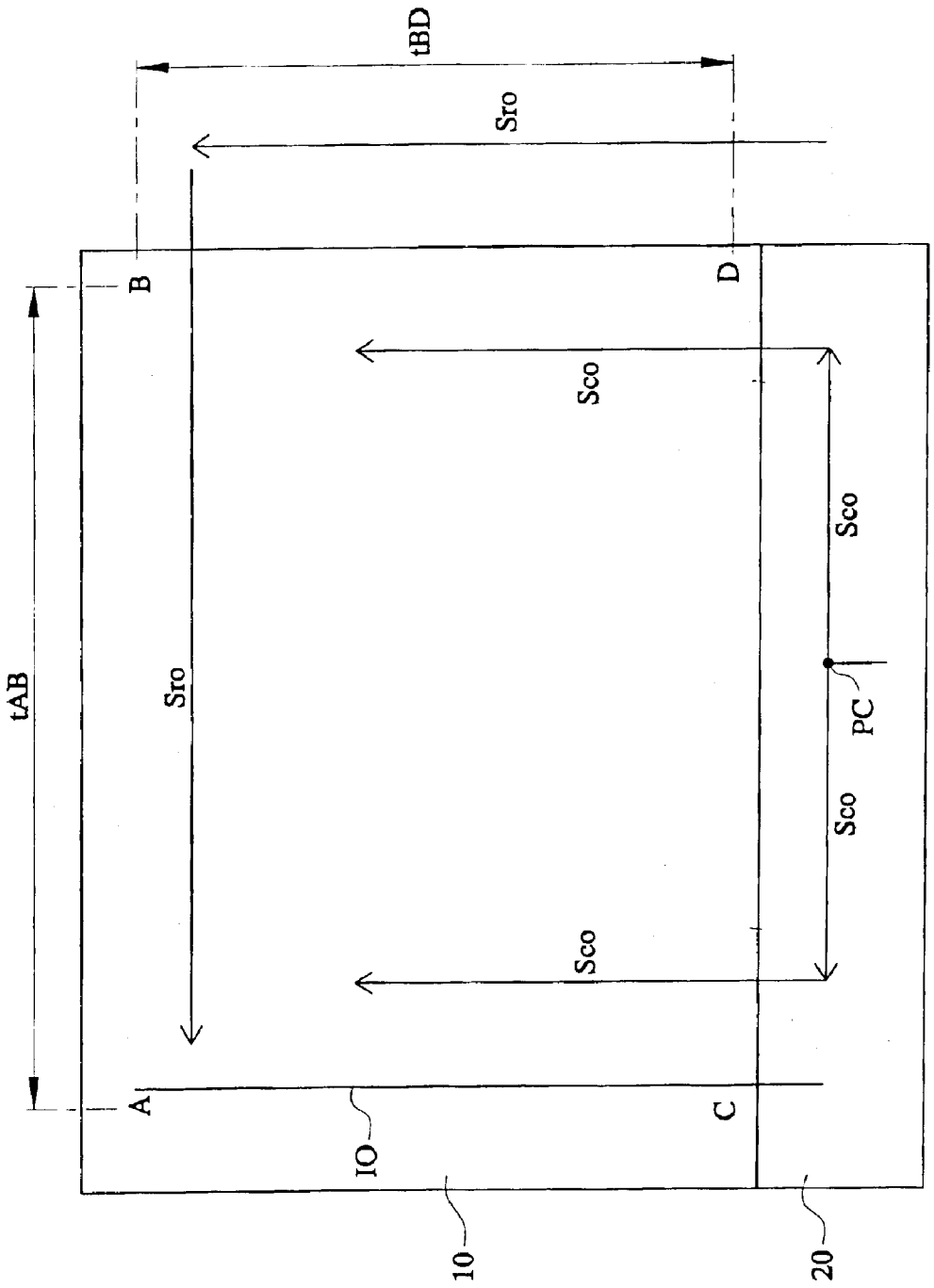
FIG. 1 is a schematic diagram of a memory core of a conventional semiconductor device.
Figure 2:
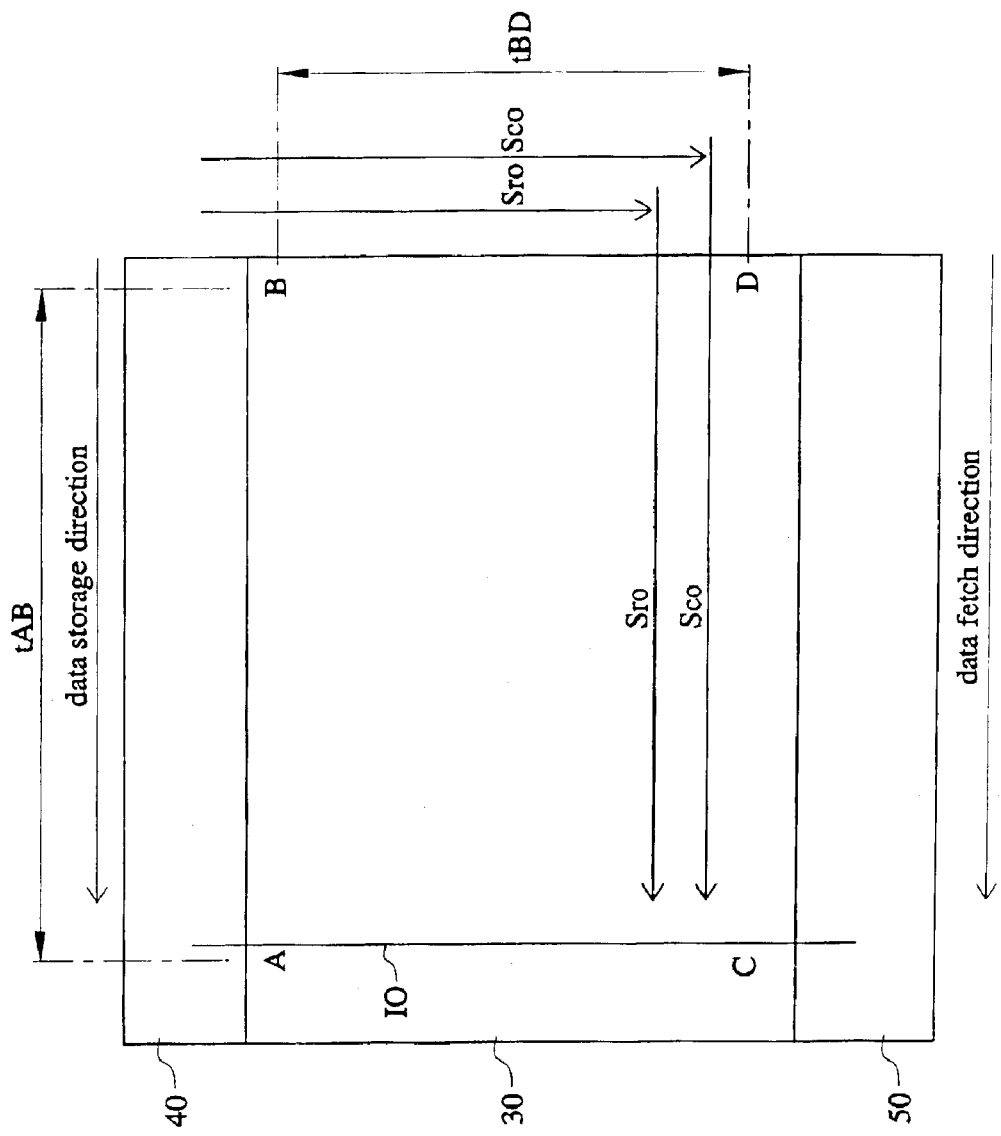
FIG. 2 is a schematic diagram of a memory core of a semiconductor memory device in accordance with an exemplary embodiment of the present invention.

FIG. 2 illustrates a schematic diagram of a memory core part of a semiconductor memory device in accordance with an exemplary embodiment of the present invention.

Referring to FIG. 2, the semiconductor memory device includes a data input circuit 40 and a data output circuit 50 separately arranged from each other. The semiconductor memory device further includes a memory core 30 positioned between the data input circuit 40 and the data output circuit 50. As an example, the memory core 30 is divided into four sections, a first section A positioned at a left upper corner of the memory core 30, a second section B positioned at a right upper corner of the memory core 30, a third section C positioned at a left lower corner of the memory core, and a fourth section D positioned at a right lower corner of the memory core.

The time for transferring a signal or data from the first section A to the second section B or vice versa is denoted by tAB. Further, the time for transferring a signal or data from the second section B to the fourth section D or vice versa is denoted by tBD.

A row control signal Sro and a column control signal Sco start from a right side of the data input circuit 40 together, and proceed downward in parallel along a right side of the memory core 30, and then run from right to left in the memory core 30. Unlike the conventional semiconductor memory device, the row and column control signals Sro, Sco are simultaneously or substantially simultaneously generated and proceed together to the memory core 30.

The total data outputting time Tdout required for outputting data from each of the sections A–D of the memory core 30 is calculated as follows.

For the first section A, the total data outputting time Tdout for outputting data from the first section A of the memory core 30 is equal to the sum of a time tAB required for the row control signal Sro and the column control signal Sco to reach the first section A, a time tRA which is an operating time of the memory core at the first section A and a time tBD required for data to run from an input/output line 10 to the data output circuit 50; that is, Tdout=tAB+tBD+tRA.

For the second section B, the total data outputting time Tdout for outputting data from the second section B of the memory core is equal to the sum of a time "0" required for the row and column control signals Sro and Sco to reach the second section B, a time tRB which is an operating time of the memory core at the second section B and a time tBD required for data to run from an input/output line IO to the data output circuit 50; that is, Tdout=tBD+tRB.

For the third section C, the total data outputting time Tdout for outputting data from the third section C of the memory core 30 is equal to the sum of a time tBD+tAB required for the row and column control signals Sro and Sco to reach the third section C, a time tRC which is an operating time of the memory core at the third section C and a time "0" required for data to run from an input/output line IO to the data output circuit 50; that is, Tdout=tAB+tBD+tRC.

For the fourth section D, the total data outputting time Tdout for outputting data from the fourth section D of the memory core 30 is equal to the sum of a time tBD required for the row and column control signals Sro and Sco to reach the fourth section D together, a time tRD which is an operating time of the memory core at the fourth section D and a time "0" required for data to run from an input/output line IO to the data output circuit 50; that is, Tdout=tBD+tRD.

If the operating times at all the sections A–D are the same, tRA=tRB=tRC=tRD=core. Therefore, the total data outputting times Tdout in the first section A and the third section C are the same, tAB+tBD+core. Further the total data outputting times Tdout in the second section B and the fourth section D are the same, tBD+core. On the other hand, since the semiconductor memory device is designed in the way that a fetch operation begins when the row and column control signals Sro and Sco reach the memory core 30, signal skew is caused between the first section A (or the third section C) and the second section B (or the fourth section D) by the time tAB. As a result, signal delay is the same over the entire memory core.

Further total data inputting time Tdin for inputting data to each of the sections A–D are calculated as follows. For calculating the total data inputting time, time delay caused by the data input/output line IO is not considered because the data is simultaneously input to the memory core along with the row and column control signals Sro and Sco.

For the first section A, the total data inputting time Tdin for inputting data to the first section A of the memory core is equal to the sum of a time tAB required for the row control signal Sro and the column control signal Sco to reach the first section A and a time tRA which is an operating time of the memory core at the first section A; that is, Tdin=tAB+tRA.

For the second section B, the total data inputting time Tdin for inputting data to the second section B of the memory core is equal to the sum of a time "0" required for the row and column control signals Sro and Sco to reach the second section B and a time tRB which is an operating time of the memory core at the second section B; that is, Tdin=tRB.

For the third section C, the total data inputting time Tdin for inputting data to the third section C of the memory core 30 is equal to the sum of a time tBD+tAB required for the row and column control signals Sro and Sco to reach the third section C and a time tRC which is an operating time of the memory core at the third section C; that is, Tdin=tAB+tBD+tRC.

For the fourth section D, the total data inputting time Tdin for inputting data to the fourth section D of the memory core 30 is equal to the sum of a time tBD required for the row and column control signals Sro and Sco to reach the fourth section D together and a time tRD which is an operating time of the memory core at the fourth section D; that is, Tdin=tBD+tRD.

If the operating times at the all sections A–D are the same, tRA=tRB=tRC=tRD=core. Therefore, the total data inputting times Tdin in the sections A, B, C and D are tAB+core, core, tAB+tBD+core and tBD+core, respectively.

Therefore, there is a signal delay between the first section A and the second section B by a time tAB. However, since a time delay caused by a data storing operation in the memory core is almost the same as the time delay of the row and column control signal, there is no signal skew between the first section A and the second section B. Further, there is no signal skew between the third section C and the fourth section D.

Further, there is a time delay of tBD between the first section A and the third section C or between the second section B and the fourth section D. However, since a time required for the row and column control signals to reach the these sections is almost the same as the time delay caused by the data input/output line IO there is no signal skew on the whole of the memory core 30.

In accordance with exemplary embodiments of the present invention as described above, when the data is input to the memory core or output from the memory core, time delay of signals is almost the same over the entire memory core. Accordingly, signal margin for inputting and outputting the data may be not necessary, thereby making it possible to design a semiconductor memory device operating at high speed.

In accordance with exemplary embodiments of the present invention as described above, the number of memory section is not limited to four and may be any number as would be known to one of ordinary skill in the art. Also, certain directions are referred to in the above-described embodiments; however other direction could be used as would be known to one of ordinary skill in the art. For example, up and down could be reversed as could left and right. Further up/down may be replaced with left/right as would be known to one of ordinary skill in the art.

While the invention has been particularly shown and described with reference to exemplary embodiments thereof, it will be understood by those ordinary skilled in the art that the foregoing and other changes in form and details may be made without departing from the spirit and of the scope of invention.

What is claimed is:

1. A semiconductor memory device including a memory core, a data input circuit, a data output circuit, at least one data input/output line, at least one row control signal line and at least one column control signal line, wherein the data input circuit and the data output circuit are separately arranged, the memory core is positioned between the data input circuit and the data output circuit, the data input/output line extends from the data input circuit to the data output circuit across the memory core, and the row control signal line and the column control signal line start simultaneously from a first side of the data input circuit and proceed in parallel along a side of the memory core, and then run from the first side of the memory core to an opposite side of the memory core.

2. The semiconductor memory device according to claim 1, wherein the semiconductor memory device has the same skew over the entire memory core.

3. The semiconductor memory device according to claim 1, wherein a data input direction is the same as a direction of the row and column control signals.

4. The semiconductor memory device according to claim 1, wherein a data output direction is the same as a direction of the row and column control signals.

5. The semiconductor memory device according to claim 1, wherein a direction of a data storing control signal is the same as a direction of the row and column control signals.

* * * * *